United States Patent [19]

Allen et al.

[11] Patent Number: 4,810,601
[45] Date of Patent: Mar. 7, 1989

[54] TOP IMAGED RESISTS

[75] Inventors: Robert D. Allen, San Jose, Calif.; Kaolin N. Chiong, Pleasantville; Ming-Fea Chow, Poughquag, both of N.Y.; Scott A. MacDonald, San Jose, Calif.; Jer-Ming Yang, Yorktown Heights, N.Y.; Carlton G. Willson, San Jose, Calif.

[73] Assignee: International Business Machines Corporation, Armonk, N.Y.

[21] Appl. No.: 880,212

[22] Filed: Jun. 30, 1986

Related U.S. Application Data

[63] Continuation-in-part of Ser. No. 679,527, Dec. 7, 1984, abandoned.

[51] Int. Cl.$^4$ .................. G03C 3/00; G03C 5/00; B05D 3/06
[52] U.S. Cl. .................. 430/18; 430/325; 430/311; 430/313; 430/323; 430/331; 430/296; 430/299; 430/942; 430/966; 430/967; 430/272; 430/190; 430/193; 156/643; 427/54.1; 427/53.1; 427/44; 427/35; 427/36; 427/38
[58] Field of Search .............. 430/325, 311, 313, 323, 430/331, 296, 299, 942, 966, 967, 272, 190, 193, 18; 156/643; 427/54.1, 53.1, 44, 35, 36, 38

[56] References Cited

U.S. PATENT DOCUMENTS

| | | | |
|---|---|---|---|
| 4,357,369 | 11/1982 | Kilichowski et al. | |
| 4,426,247 | 1/1984 | Tamamura et al. | |
| 4,430,153 | 2/1984 | Gleason et al. | |
| 4,433,044 | 2/1984 | Meyer et al. | |
| 4,552,833 | 11/1985 | Ito et al. | 430/325 |
| 4,600,686 | 7/1986 | Meyer et al. | 430/326 |
| 4,606,932 | 8/1986 | Oprysko et al. | 427/53.1 |
| 4,613,398 | 9/1986 | Chiong et al. | |

FOREIGN PATENT DOCUMENTS

| | | |
|---|---|---|
| 0184567 | 6/1986 | European Pat. Off. |
| 2154330 | 9/1985 | United Kingdom |

OTHER PUBLICATIONS

T. Venkatesan et al., "Plasma–developed ion–implanted resists with submicron resolution", *Journal of Vaccuum Science and Technology*; vol. 19, 1981, pp. 1379–1384.

Y. W. Yau et al, "Generation and applications of finely focused beams of low–energy electrons" pp. 1048–1052, *Journal of Vaccuum Science and Technology*, vol. 19, 1981, pp. 1048–1052.

Roland et al, *SPIE*, vol. 631, Advances in Resist Technology and Processing III (1986), pp. 34–40.

G. N. Taylor et al, "Gas–Phase–Functionalized Plasma–Developed Resists:Initial Concepts and Results for Electron Beam Exposure", pp. 1658–1664, *Journal of Electrochemical Society: Solid State Science and Technology*, Jul. 1984.

Primary Examiner—John L. Goodrow
Assistant Examiner—Cynthia Hamilton
Attorney, Agent, or Firm—Shirley Church Moore; John A. Stemwedel

[57] ABSTRACT

The present invention is concerned with methods of converting a single resist layer into a multilayered resist.

The upper portion of the single resist layer can be converted into a dry-etch resistant form. The conversion can be a blanket conversion of the upper portion of the resist layer or can be a patterned conversion of areas within the upper portion of the layer. A patternwise-converted resist can be oxygen plasma developed.

The upper portion of the single resist layer can be patternwise converted into a chemically different composition or structure having altered absorptivity toward radiation. The difference in radiation absorptivity within the patterned upper portion of the resist enables subsequent use of blanket irradiation of the resist surface to create differences in chemical solubility between areas having the altered absorptivity toward radiation and non-altered areas. The difference in chemical solubility enables wet development of the patterned resist.

28 Claims, 6 Drawing Sheets

TOP IMAGED RESISTS

BACKGROUND OF THE INVENTION

1. Related Application

This application is a continuation-in-part of U.S. Application Ser. No. 679,527, filed 12/07/84, now abandoned.

2. Field of the Invention

The present invention is concerned with chemical-physical methods of converting a single layer of resist into a multilayer resist. The methods of conversion can be used to create at least two different types of structures useful in producing microelectronic devices: (1) the upper portion of a layer of organic polymeric material can be converted into a dry-etch resistant form. The converted upper portion may or may not be converted in the form of a pattern. (2) the upper portion of a layer of polymeric material can be patternwise converted into a chemically different composition or structure having altered absorptivity toward radiation. When the upper portion of the resist which is converted is patterned, the methods can be used to produce multi-layer resists which are plasma-developable in case (1), or solvent-developable in case (2), and which resists are capable of providing submicron resolution.

3. Background Art

Many of the recent advancements in electronic components have resulted from improvements in manufacturing techniques, and particularly from microlithography improvements. However, often such improvements have been achieved by increasing the complexity of the microlithographic process, e.g. the number of resist layers utilized to obtain a particular functional configuration in the finished electronic component. The additional process steps required to provide the additional resist layers significantly increase the overall cost of production for a given functional configuration. There is a continuing search for methods of simplifying the microlithography utilized to produce a given electronic component.

Another current trend in microlithography is the use of dry etching techniques to develop the resist image. This is because conventional wet processes which utilize solvent development do not provide the anisotropic development considered necessary to achieve optimal dimensional control within the parameters of today's systems. Examples of dry-developable resists are provided in U.S. Pat. Nos. 4,426,247 Tamamura et al., 4,433,044 Meyer et al., 4,357,369 Kilichowski et al., and 4,430,153 Gleason et al. All of these patents make use of silicon to create an oxygen plasma-developable resist. In some cases the silicon is present as a part of the resist polymer initially; in other cases, after the resist polymer is applied to a substrate, it is reacted with a silicon-containing reagent to make it oxygen plasma developable. A recent example of the latter type of plasma-developable resist is described in U.S. Pat. No. 4,552,833 to Ito et al. (assigned to the assignee of the present invention). However, none of these processes are directed to producing a multilayer resist via top imaging of a single layer of resist material.

Persons working in the field of semiconductor technology have developed techniques of generating a thin etch barrier in the surface of a resist film, as described by T. Venkatesan et al, J. Vac. Sci. Technol., 19, 1379–1384 (1981), wherein a focused indium ion beam was used to write a pattern onto the surface of an organic polymer. When the resist was subjected to oxygen RIE, the surface of the ion implanted regions was oxidized to indium oxide, which functioned as the etch barrier. Hence a negative tone relief image was generated.

The use of a retarding field to confine the radiation from a resist imaging source to the resist surface was described by Y. W. Yau et al., J. Vac. Sci. Technol., 19, 1048 (1981). A technique for use with an electron-beam (E-beam) irradiation source was developed, wherein a standard E-beam was accelerated at 25 Kev but the polymeric resist atop a substrate was mounted on support which is at some negative potential (for example −20 Kev). Thus, the electrons traveled down the beam column at 25 Kev, but as they neared the resist, they were slowed down by the potential on the support holding the resist structure; the electrons entered the resist at a net acceleration voltage of about 5 Kev (25−20=5). Of course the voltage that is applied to the resist structure support can be adjustable so that the final acceleration voltage of the electrons can be varied from about 0 Kev to about 25 Kev.

A process which reduces the number of resist layer applications required to obtain high resolution submicron electronic component features while simultaneously providing for dry development would be particularly useful in the manufacture of electronic components.

Even though it is recognized in the art that dry development provides resolution advantages, it is also recognized that the oxygen plasma systems used to achieve dry development are expensive and frequently provide reduced throughput rates. Thus, there is also an interest in use of the concept of converting a single layer resist into a multiple layer resist by methods which permit the use of processing equipment which is more commonly used in the art.

SUMMARY OF THE INVENTION

In accordance with the present invention, methods of converting a single layer resist into a multilayer resist using processes controlled by chemical-physical techniques are provided herein. One of the typical methods provides for converting the upper portion of a layer of polymeric material or sensitized polymeric material into a dry etch-resistant form. Oxygen plasma can then be used to develop the entire resist structure. The lithographic process can utilize either high-absorptivity radiation-sensitive polymers or sensitized high-absorptivity polymeric material which can be top imaged upon exposure to a radiation source; a radiation source which exerts limited penetration of the layer of polymeric material or sensitized polymeric material in general, such as low voltage electron beam radiation; or transparent radiation-sensitive polymers or sensitized polymeric material with a penetrating radiation source, but carefully controlled conditions in subsequent process steps. For purposes of this specification and the claims, "radiation" should be interpreted to include both photon (ultraviolet light from 150 nm–600 nm) and radiation emission sources such as electron beam, ion beam, and X-ray.

Another of the typical methods provides for converting patterned areas of the upper portion of a layer of polymeric material or sensitized polymeric material into a chemically different composition or structure having altered absorptivity toward radiation. The difference in radiation absorptivity within the patterned resist enables subsequent use of blanket irradiation of the resist surface to create differences in chemical solubility between areas having the altered absorptivity toward radiation and non-altered areas. Depending on whether one desires to create a positive tone patterned resist or a negative tone patterned resist, it is necessary to vary the technique used within this general concept. (A negative tone patterned resist is obtained when the portion of the resist exposed to the patterned radiation remains after development of the pattern, a positive tone patterned resist is obtained when the portion of the resist exposed to the patterned radiation is removed during development of the pattern.)

To obtain a positive tone patterned resist, one can expose the resist to patterned radiation which is confined to the top portion of the resist either because the resist material is highly absorbing of the radiation or because the radiation itself exhibits limited penetration ability. The advantage of confining the radiation to the upper portion of the resist is that the image created is not affected by the topography of the substrate below the resist, i.e. image distortion resulting from incident radiation reflecting or backscattering off the substrate under the resist is avoided. The exposed resist is treated with an agent which either permeates preferentially or reacts preferentially in the unirradiated portion of the pattern. The agent must be a "dye" such that after the upper portion of the resist has been treated with the agent, the unirradiated portion of the pattern absorbs strongly at some wavelength at which the original resist material is both sensitive and significantly transparent. The dye-treated resist is then flood exposed at a wavelength at which the dyed portions are strongly absorbing and the non-dyed, original resist material is both sensitive and significantly transparent. The positive tone relief image is then developed using an appropriate solvent which removes the resist material in the non-dyed areas of the pattern which were patternwise irradiated initially (prior to the floor exposure irradiation).

To obtain a negative tone patterned resist, one exposes the resist to patterned radiation which is confined to the top portion of the resist for reasons described above. The exposed resist is treated with a dye which either preferentially permeates or reacts preferentially with the irradiated portion of the pattern. The dye-treated resist is then flood exposed at a wavelength at which the dyed portions are strongly absorbing, as described above. The negative tone relief image is then developed using an appropriate solvent which remove the resist material in the non-dyed areas of the pattern which were not patternwise irradiated initially, but which were subsequently flood exposed with radiation.

It is possible to use a resist material and a radiation source such that the penetration of the radiation is not confined to the upper portion of the resist layer. It is then necessary to limit the penetration of the dye into the resist layer so that only the upper portion of the resist layer is permeated by or reacts with the dye. This is accomplished by controlling process conditions during application of the dye, such as time, temperature and pressure and by controlling the form in which the dye is applied such as vapor or liquid. The dye may be applied as part of a mixture in order to alter the penetration rate of the dye into the resist layer, for example, a solvent for the resist material may be added to the dye wherein the concentration of the solvent controls the rate of penetration of the dye. However, using dye penetration control to achieve top-imaging is not as desirable as confining the radiation itself to the top portion of the resist, for reasons described previously.

In the most preferred embodiment of the present invention wherein the upper portion of the resist is converted to a dry etch-resistant form, a layer of high-absorptivity polymeric material is exposed to radiation which creates reactive hydrogens in the upper portion of the layer by molecular rearrangement in the irradiated area. The reactive hydrogens are subsequently reacted with an organometallic reagent to form an etch barrier within the upper portion of the layer. In the case of a resist which is to be imaged pattern-wise, the layer of polymeric resist material is exposed to patterned radiation which creates the reactive hydrogens within the upper portion of the layer in the pattern-wise irradiated areas. The irradiated resist is treated with an organometallic reagent to create patterned etch resistance in the upper portion of the layer. Preferred metallic portions of the organometallic compound comprise silicon, tin, germanium and titanium. Subsequent development of the resist image using dry development methods such as oxygen plasma produces at least a two-layer resist pattern with high aspect ratio and straight walls or undercut profiles, depending on etch conditions utilized. A resist pattern with more than two layers can be obtained by applying the polymeric resist to be imaged over other layers of polymeric resist material. The other layers of polymeric resist material need not be sensitive to radiation.

One example of the above preferred embodiment of the present invention wherein a pattern-wise imaged two-layer resist is formed comprises:

(a) providing a layer of polymeric material comprised of a radiation-sensitive component selected from the group consisting of (1) o-nitrobenzyl derivatives, which rearrange on exposure to radiation to form alcohols, acids, and amines, (2) photo-fries reactive units, (3) diazoketones, and (4) mixtures thereof;

(b) pattern-wise irradiating surface portions of the layer of polymeric material to induce molecular rearrangement of the radiation-sensitive component within the upper portion of the layer, to form reaction products having labile and reactive hydrogens in the upper portions of the irradiated areas; and (c) treating the reaction products of the irradiated layer with an organometallic reagent to react and bond the organometallic reagent at the reactive hydrogen sites.

An additional step can be used to dry develop the two layer resist, comprising:

(d) developing the patterned image by treatment with an oxygen plasma.

When the polymeric material portion of the resist is transparent to the imaging radiation and the image created extends through the entire resist thickness, top imaging is achieved by controlling the depth of penetration of the organometallic reagent.

Another preferred embodiment of the present invention which is very similar to the embodiment described above provides for use of a sensitized polymeric resist material. The sensitizer undergoes chemical alteration upon irradiation. The altered sensitizer is reacted with the polymeric component of the polymeric resist material to form functional groups capable of reacting with an organometallic compound in the upper portion of the resist layer.

In yet another preferred embodiment of the present invention wherein the upper portion of the resist is converted to a dry etch-resistant form, a source of radiation whose depth of penetration can be controlled is utilized, to limit penetration of the radiation to the upper portion of the irradiated areas of the resist. After the exposure to the radiation, the exposed resist is treated with an organometallic reagent such as a silylating reagent, which is incorporated into patterned upper portions of the resist layer. A positive tone resist or a negative tone resist can be obtained, depending on the types of functional groups created or destroyed by the applied radiation.

One example of the preceeding embodiment is the use of a low voltage (0.1 to 10 Kev) electron beam to control the depth of penetration of the radiation. The method of converting a patterned upper portion of a resist layer to an etch-resistant form then comprises:

(a) applying to a substrate a layer of a polymeric resist material comprising a polymer and a photosensitive material (sensitizer) which generates an acid upon exposure to radiation, wherein the polymer comprises acid labile groups pendant from the polymer backbone;

(b) patternwise irradiating surface areas of the layer of the sensitized polymeric resist material using the low voltage electron beam radiation to induce the sensitizer to generate an acid in the upper portions of the resist layer exposed to radiation;

(c) heat treating the irradiated resist to generate reactive functional groups such as —COOH, —OH, —NH$_2$, —SO$_2$NH$_2$, —SH,

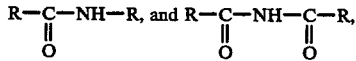

wherein R is part of the polymeric structure of the resist;

(d) treating the irradiated, heat-treated layer with an organometallic reagent to react and bond the organometallic reagent at the reactive sites within the upper portion of the resist; and (e) developing the patterned image by treatment of the resist with an oxygen plasma.

In the preferred embodiments of the present invention wherein the upper portion of the resist is converted into a chemically different composition or structure having altered absorptivity toward radiation, conversion of only the upper portion of the resist provides an advantage during imaging of the resist since the image created is not affected by topographic features of the underlaying substrate, as previously described.

In the most preferred embodiment of the present invention wherein the absorptivity toward radiation is patternwise altered, the resist can be of any chemical structure which will undergo a radiation induced transformation that results in the generation of a functional reactivity difference between the exposed and the unexposed areas. This transformation is followed by application of a dye to the surface of the resist which reacts with the resist in the desired patterned areas, creating patterned differences in absorptivity toward radiation.

The resist may also be a polymeric material or sensitized polymeric material which undergoes a physical change at the surface, upon exposure to radiation, to inhibit or accelerate the diffusion of dye into the film; use of irradiation to create preferential permeation of reactants in general is disclosed in U.S. patent application Ser. No. 741,779 to Chiong et al. (assigned to the assignee of the present invention) which is hereby incorporated by reference.

Embodiments of the present invention provide that the layer of resist ranges from about 0.5 micrometer to about 20 micrometers in thickness, and that the upper portion of the layer which undergoes reaction with the organometallic reagent ranges form about 0.1 to 1.0 micrometer in depth.

Preferred embodiments of the present invention provide that the layer of resist ranges from about 1 to about 3 microns in thickness, and that the upper portion which undergoes reaction with the organometallic reagent ranges from about 0.1 to about 0.5 micrometers in depth.

Materials which can be used to create both the etch-resistant and the dyed resists of the types described above, include but are not limited to compounds selected from the groups consisting of:

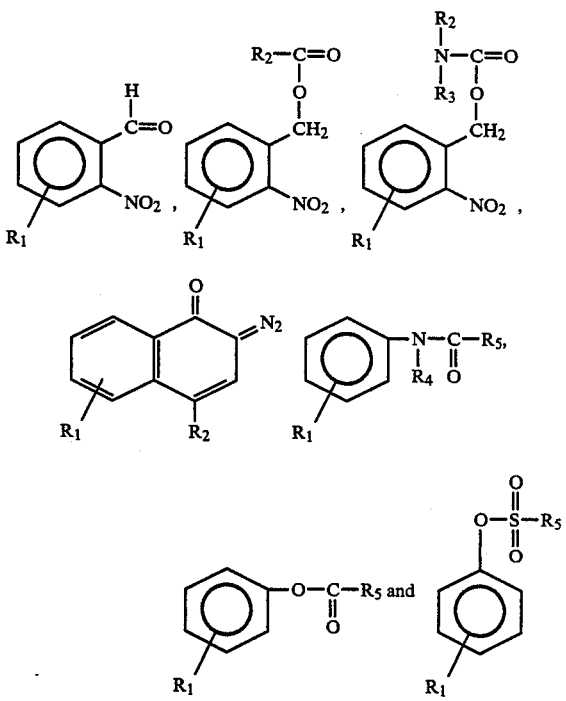

wherein $R_1$, $R_2$, $R_3$ and $R_5$=H, alkyl, aryl or part of a polymer backbone, and $R_4$=H, $C_nH_{2n+1}$ wherein n ranges from 1 to about 5, phenyl or substituted phenyls.

Sensitized polymeric materials which can be used to create both the etch-resistant and the dyed resists of the type described above, include but are not limited to compositions comprising a polymer having recurrent acid labile groups combined with an acid progenitor which generates acid on exposure to radiation (the "sensitizer" in this case). The acid labile groups may be present in the polymer backbone or may be pendant to the polymeric backbone. The polymers comprising the recurrent acid labile groups typically can be amides, urethanes, esters, ethers, non-basic amines, and ureas. Examples of polymers having recurrent acid labile groups present in the polymer backbone include polycarbonates and polyethers. Examples of polymers having recurrent acid labile pendant groups include substituted polyvinylbenzoates; and, substituted polyvinylphenols, substituted polystyrenes, substituted maleimide comprising polymers, and substituted styrene-maleimide copolymers, wherein phenyl or nitrogen moieties within the polymeric structure are substituted with an acid labile functional group such as a carboxylic acid ester or a carbonic acid ester. Esters which undergo $A_{AL}-1$ type hydrolysis and which have an available proton adjacent to the carbonium ion formed during hydrolysis, or which undergo rearrangement such that a carbonium ion is generated with an adjacent ($\alpha$) proton, are suitable. It is possible to have the acid labile functional group be attached to the phenyl or nitrogen moiety through a spacer group. A few of these types of structures are set out below for purposes of example:

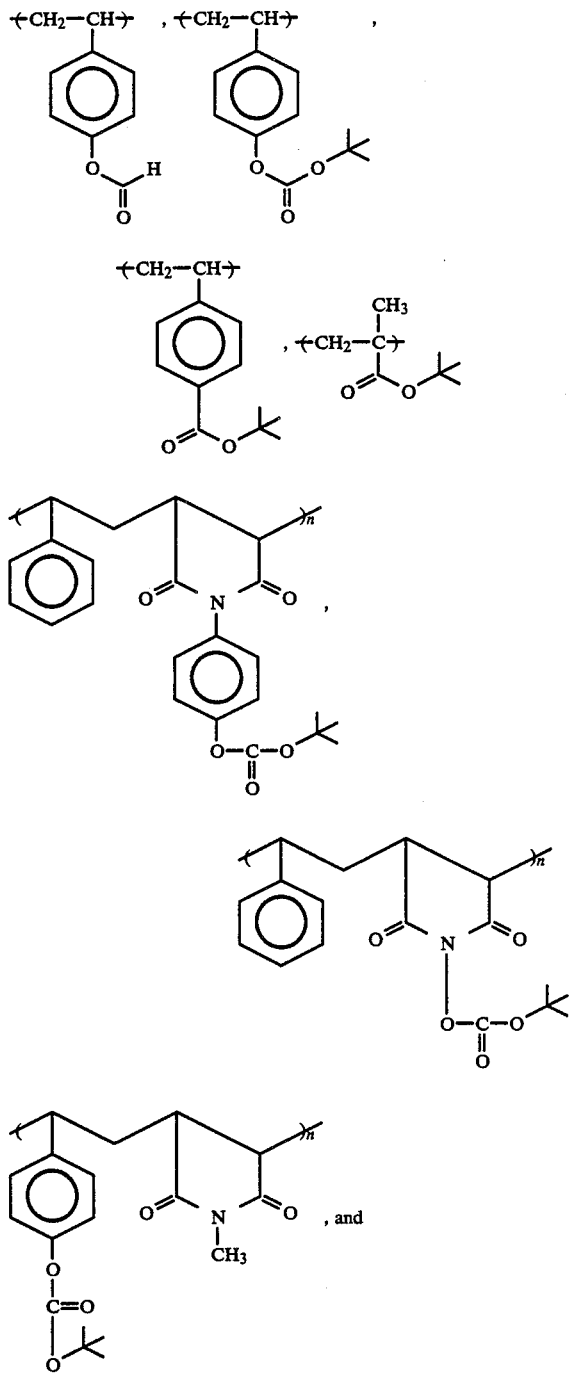

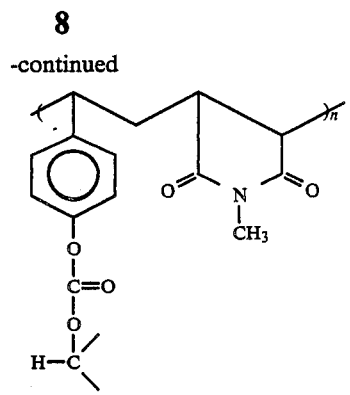

The acid progenitor which generates acid on exposure to radiation can be any suitable photoactive compound, such as onium salts. For purposes of example, these onium salt sensitizers include unsubstituted and symmetrically or unsymmetrically substituted diaryliodonium, triarylsulfonium, triarylselenonium, and substituted aryldiazonium salts of the conjugate bases of strong acids. Some of the methods of the present invention reduce the number of resist layer applications required to obtain high resolution submicron electronic component features while simultaneously providing for dry development of the resist image.

Other of the methods of the present invention reduce the number of resist layer applications required while providing for wet development of the resist.

The above and many other features and attendant advantages of the invention will become apparent as the invention becomes better understood by reference to the following accompanying drawings and detailed description.

DESCRIPTION OF THE PREFERRED EMBODIMENTS

Figure 1:
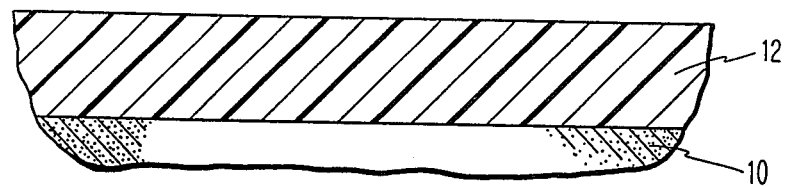
FIG. 1 is a diagramatic cross-sectional view of a substrate with a layer of polymeric material applied to the upper surface.

The polymeric material used to create the top-imaged two-layer resist can be comprised of a number of different materials, so long as reactive hydrogens are created upon irradiation. Polymeric resist materials which meet this requirement include o-nitrobenzene derivatives, polymers capable of photo-fries rearrangement, diazoketones, and mixtures thereof. Upon irradiation, acids, alcohols, and amines with reactive hydrogens are generated. Examples of such materials include:

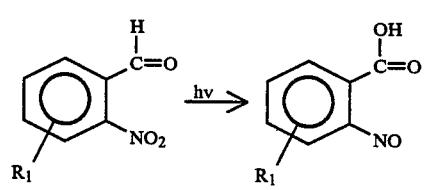

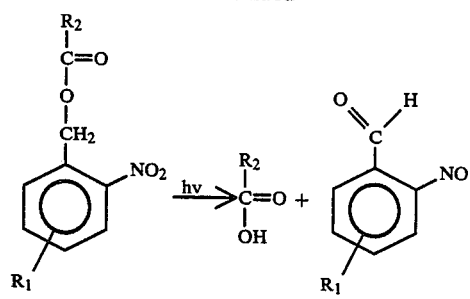

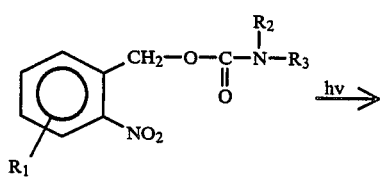

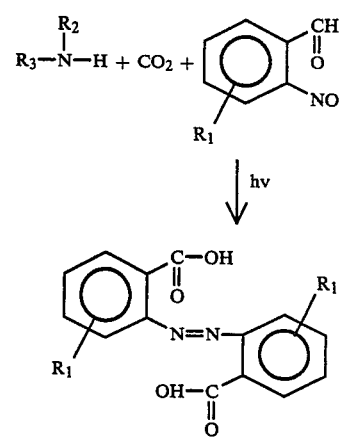

wherein $R_1$, $R_2$, and $R_3$=H, alkyl, aryl, or part of a polymer backbone.

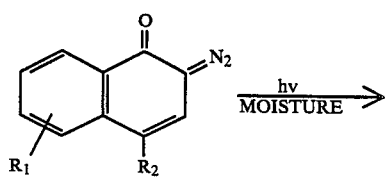

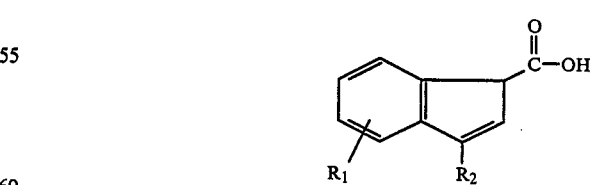

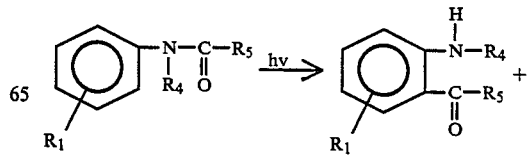

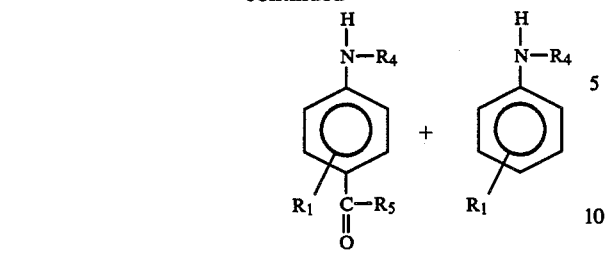

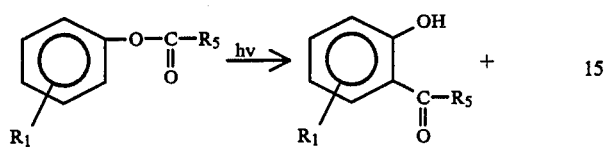

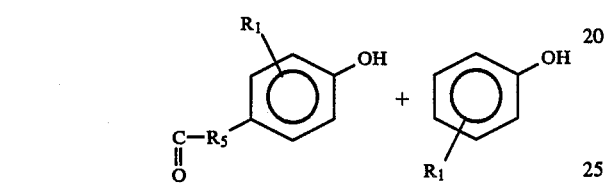

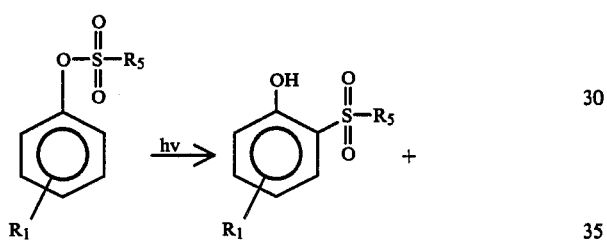

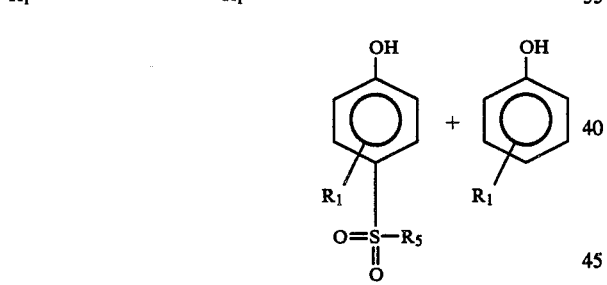

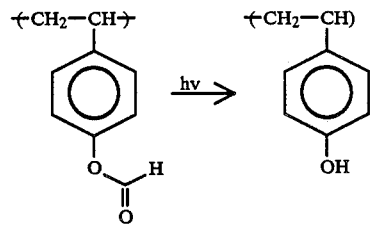

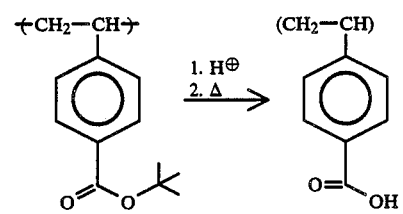

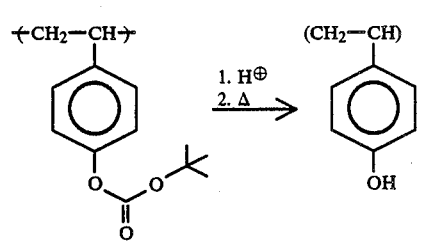

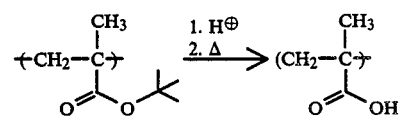

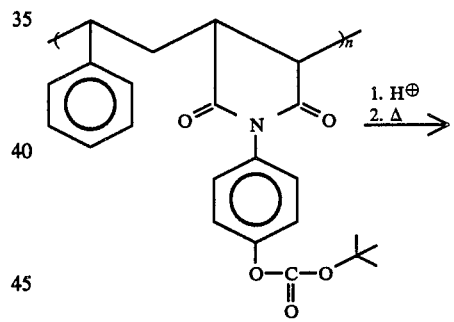

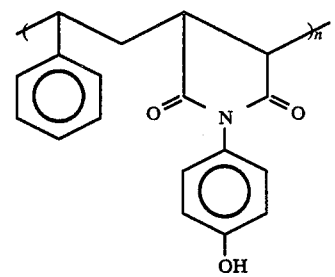

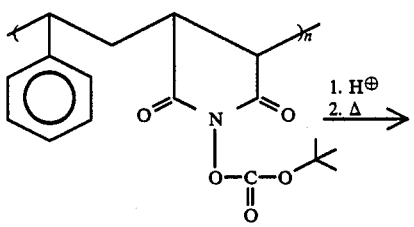

wherein $R_1$, $R_2$, $R_3$ and $R_5$=H, alkyl, aryl, or part of a polymer backbone, and $R_4$=H, $C_nH_{2n+1}$ wherein n ranges from 1 to about 5, phenyl or substituted phenyls.

The sensitized polymeric resist material used to create a top-imaged two layer resist may be comprised of a number of different materials so long as the reaction product of the sensitizer with the polymeric component of the resist creates functional groups capable of reacting with an organometallic reagent, a dye, or a reagent capable of producing a dye upon reaction with the polymeric portion of the resist. Examples of such sensitized materials have previously been described. The alteration of the polymeric portion of the resist to provide functional groups (capable of reacting with an organometallic reagent, a dye, or a dye creating reagent) is shown below, wherein alteration of a few of the potential materials is illustrated, for purposes of example:

-continued

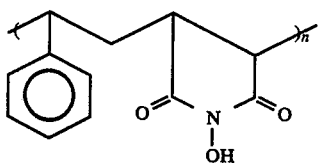

wherein the sensitizer furnished the H+.

Materials of the types described above can be used alone or in combination with compatible polymeric materials. Compounds such as substituted o-nitrobenzaldehyde, esterified phenols, and diazoquinone derivatives can be mixed together with polymers which have no reactive hydrogens or functional groups capable of reacting with the organometallic reagent or dye, e.g., PMMA (poly methyl methacrylate), rubbers, PMIPK (poly methylisopropenyl ketone), and polystyrene and its derivatives. Upon irradiation, the molecules which are sensitive to the radiation undergo rearrangement in the penetrated portion of the irradiated area of the polymeric layer, to yield products with reactive hydrogens. The reactive hydrogens can be subsequently reacted with an organometallic reagent or a dye to create a top-imaged resist. It is also possible to mix the sensitized polymeric materials previously described with other polymers which do not have functional groups capable of reacting with the organometallic reagent or dye. Upon irradiation, the sensitizer generates the acid which is subsequently reacted with acid labile groups present, to yield functional groups capable of reacting with the organometallic reagent or dye.

EXAMPLE 1

This example demonstrates a method of creating a multilayer etch-resistant, dry developable resist from a single layer of polymeric resist material.

Acetylated polyvinylphenol of the structure

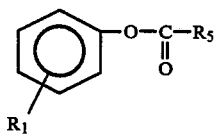

wherein $R_1$=polymer backbone structure and $R_5$=$CH_3$. was dissolved in diglyme at a concentration of about 30% by weight acetylated polyvinylphenol. The solution was applied to a silicon oxide substrate using standard spin coating techniques. After application of the solution coating, the coated substrate was dried at about 80° C. on a hotplate, to remove the diglyme solvent. FIG. 1 is a cross-sectional view of the polymeric resist material (acetylated polyvinylphenol) layer 12 atop the silicon oxide substrate 10. The thickness of the dried acetylated polyvinylphenol layer 12 was about 0.7 micrometers.

Figure 2:
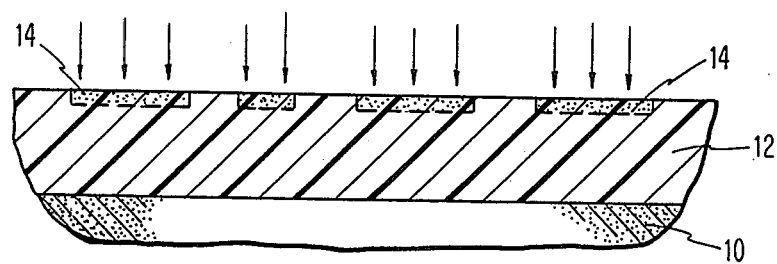
FIG. 2 shows the same cross-sectional view wherein the upper surface of the layer of polymeric material is patternwise irradiated so that molecular rearrangement occurs in the upper portion of the irradiated layer.
Figure 3:
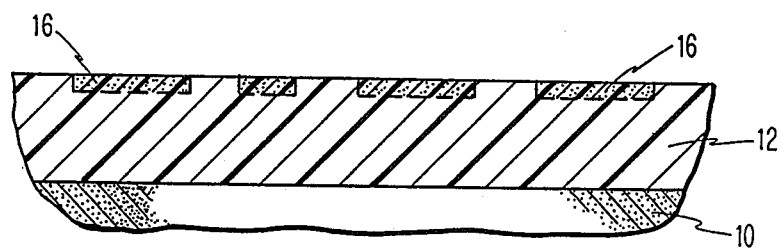
FIG. 3 shows the cross-sectional view after reaction of the reactive hydrogens created during the molecular rearrangement with an organometallic reagent.

The coated substrate was then exposed to patterned deep UV radiation at a dosages ranging from about 100 to about 800 mj/cm². FIG. 2 shows the same cross-sectional view after irradiation, wherein the irradiated areas 14 have experienced molecular rearrangement during which labile and reactive hydrogen sites have been created. Subsequently, the irradiated polymeric layer was exposed to HMDS (hexamethyldisilazane) vapor in order to silylate the active hydrogens created during the irradiation. FIG. 3 shows the cross-sectional view after treatment of the irradiated polymeric resist material with HMDS, so that a silylated dry-etch-resistant form of material 16 was created in the upper portion of the irradiated areas. A good silylated image 16 formed within approximately 40 to 50 minutes after application of the HMDS reagent to the irradiated areas.

Figure 4:
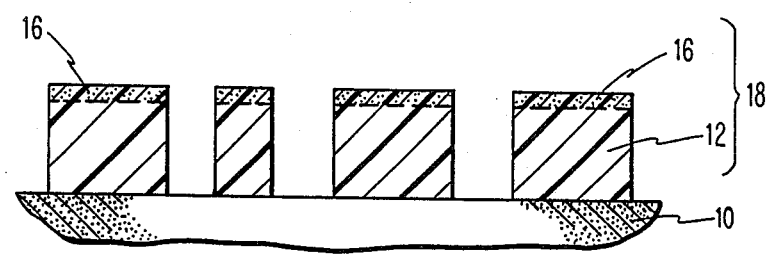
FIG. 4 shows the two-layer structure created upon the surface of the substrate upon dry development of the imaged polymeric layer.

The silylation reaction was followed by treatment of the structure described above with oxygen plasma at about one torr and 0.3 Watts/cm² for a period of about 6 minutes. The resultant two layer resist structure 18 was comprised of a silylated upper layer approximately 0.3 micrometers thick and a lower layer of acetylated polyvinylphenol about 0.4 micrometers thick, as depicted in FIG. 4. Note that treatment of an equivalent layer of unreacted polyvinylphenol with oxygen plasma under the same conditions results in ashing of the layer within about 4 to 5 minutes.

The two-layer resist formed using the above process exhibited line widths of about one micrometer wherein the line sidewalls showed negligible undercutting upon oxygen plasma development.

EXAMPLE 2

This example demonstrates a method of creating a multilayered etch-resistant, dry developable resist from a single layer of polymeric resist material. This example also demonstrates the applicability of use of low voltage electron beam irradiation to limit penetration of the radiation to the upper portion of the resist layer.

Figure 9:
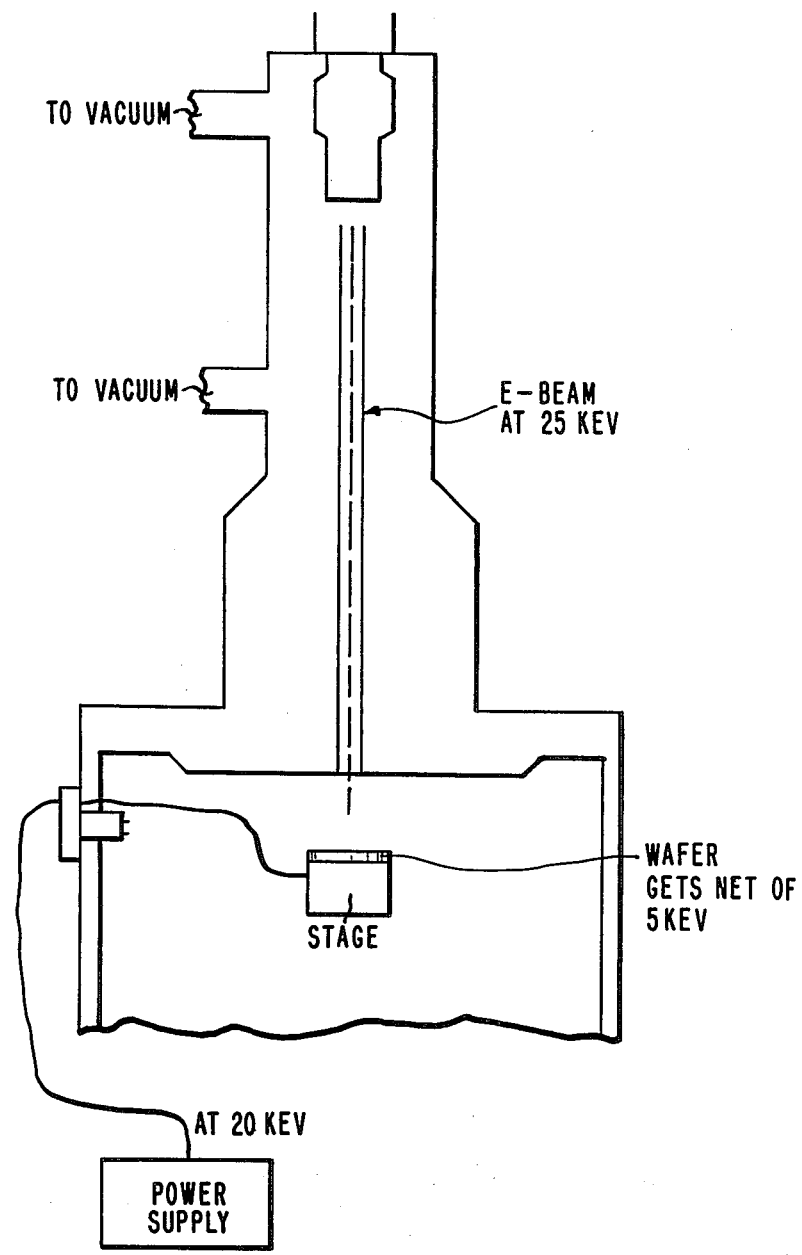
FIG. 9 shows a typical equipment set up used to obtain a low voltage electron beam irradiation of the polymeric resist surface.

A retarding potential was used to slow down the electrons in the electron-beam just before they entered the resist, confining the radiation chemistry to the upper portion of the resist. The advantage of such an irradiation system was that by confining the electron to the upper portion of the resist, we reduced backscattering from the substrate. FIG. 9 schematically represents the type of electron beam system which was used to alter the acceleration voltage of the electron beam used to image the polymeric resist material.

Figure 10:
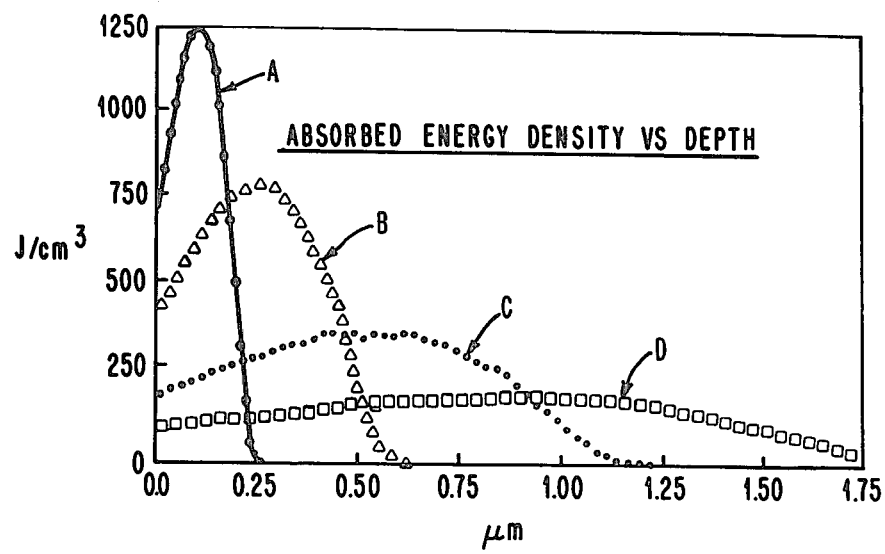
FIG. 10 shows a plot of depth of penetration of the low voltage electron beam irradiation into a layer of polymeric resist material as a function of the acceleration voltage of the electron beam and as a function of the dosage applied in terms of energy per resist surface area.

The sensitized polymeric resist system used in combination with the low voltage electron beam system was comprised of poly(tert-butyloxycarbonyloxystyrene) in combination with a triphenylsulfonium hexafluoroarsenate sensitizer. The polymeric resist material was placed in a suitable solvent and applied to a semiconductor substrate using standard spin coating techniques. The surface of the applied resist was exposed to patterned radiation of net voltage of 3 Kev (main column at 20 Kev, and support structure for the resist structure at 17 Kev) using direct write techniques. FIG. 10 shows the absorbed energy density as a function of depth of penetration of the radiation into the resist, and as a function of the Kev net voltage. The applicable net voltages: A=3, B=5, C=7.5, and D=10.

The irradiated resist structure was then heat treated for time periods ranging from about 30 seconds to about 180 seconds, at temperatures ranging from about 80° C. to about 140° C., to insure chemical conversion of the irradiated upper portions of the resist layer to a chemical structure comprising phenolic hydroxyl functional groups.

Figure 11:
FIG. 11 is a photomicrograph of a top-imaged photoresist wherein a patterned resist was prepared using low voltage electron beam irradiation.

The resist structure was then placed in a vacuum oven, heated to temperatures ranging from about 100° C. to about 150° C.; the vacuum oven was evacuated. Subsequently the vacuum oven was filled with about 120 torr of hexamethyldisilazane (HMDS). The HMDS was permitted to react with the hydroxyl functional groups in the irradiated areas of the upper portion of the polymeric resist material for a period of about 15 minutes. The resist structure was transferred from the vacuum oven to a commercially available oxygen reactive ion etching system, and the negative tone relief image was developed with 100 Watt Rf, at about 20 Sccm oxygen, at about 80 mtorr for a period of about 12 minutes. FIG. 11 is a photomicrograph showing the developed negative tone patterned resist structure.

EXAMPLE 3

This example demonstrates a method of creating a multilevel solvent-developable resist from a single layer of polymeric resist material.

Figure 5:
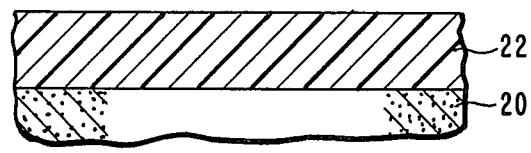
FIG. 5 is a diagramatic cross-sectional view of a substrate with a layer of polymeric material applied to a major surface.

The polymeric resist material was comprised of poly(tert-butyloxycarbonyloxy-styrene) combined with a triphenylsulfonium hexafluoroantimonate sensitizer. The polymeric resist material was placed in a solvent and applied to a semiconductor substrate using spin coating techniques well known in the art, to generate about a 2 micrometer thick film on the semiconductor substrate. FIG. 5 depicts a cross-sectional view of the polymeric resist material 22 atop the silicon wafer substrate 20 used for this particular example.

Figure 6:
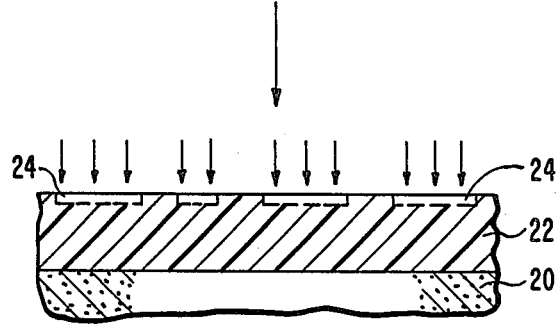
FIG. 6 shows the same cross-sectional view as shown in FIG. 5 wherein the surface of the layer of polymeric material is patternwise irradiated so that the upper portion of the layer is converted into a chemically different structure.

The resist structure was exposed through a mask using a dosage of about 0.5 mJ/cm$^2$ of 220 nm light to alter the sensitizer, thereby generating acid within the upper portions of the irradiated resist areas, as shown in FIG. 6.

The acid was limited to the upper portions of the irradiated resist areas because the resist material absorbs strongly at the 220 nm light wavelength. The resist material was then heat treated at a temperature of about 100° C. for a period of about 2 minutes to convert the upper portions of the irradiated areas of the polymeric resist layer 22 to a chemical structure comprising phenolic hydroxyl functional groups 24.

The resist structure was then placed in a vacuum oven approximately one liter in size, at about 120° C. and the vacuum oven chamber was evacuated. About 5 cc of triethylamine was injected into the vacuum oven chamber, and after about 5 minutes about 10 cc of phenyl isocyanate was also injected. The resist structure was exposed to the isocyanate for a period of about 10 minutes, after which the residual triethylamine and phenyl isocyanate vapors were pumped out of the vacuum oven. The amine was used to catalyze the reaction between the phenyl isocyanate and the functional hydroxyl groups of the polymeric resist material, and any equivalent organic base could have been used. In this particular case it was necessary to add the amine separately from the phenyl isocyanate in order to avoid a direct reaction between these two materials. The isocyanate can be any isocyanate capable of reacting with the phenolic hydroxyl to form a chromphore which has the necessary absorbance properties; however, phenyl isocyanate or a substituted phenyl isocyanate is preferred when the reactant is to be a gas phase reactant.

Figure 7A:
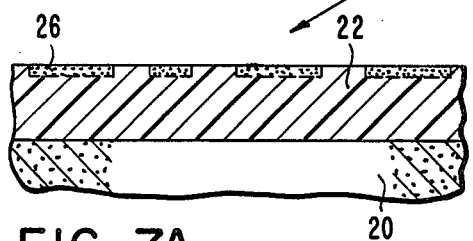
FIG. 7A shows the structure of FIG. 6 after treatment with an absorbing dye, wherein the irradiated, chemically altered area of the resist reacts with or is permeable to the dye.
Figure 7B:
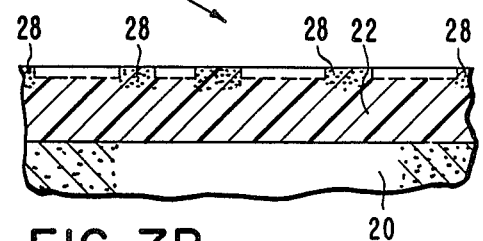
FIG. 7B shows the structure of FIG. 6 after treatment with an absorbing dye, wherein the non-irradiated, unaltered area of the resist reacts with or is permeable to the dye.

After removal of the triethylamine and phenyl isocyanate vapor, the resist structure was heat treated for about 10 to about 15 minutes at about 130° C. to about 135° C. under reduced pressure ranging from about 0.1 to about 1.0 torr, to remove any residual amine or isocyanate which is physically present on the resist surface but not reacted with the functional hydroxyl groups of the polymeric resist material. Reaction of the phenyl hydroxyl functional groups in the irradiated upper portions of the polymeric resist material with the triethylamine and phenyl isocyanate results in the formation of urethane in the upper portions of the irradiated areas 26, as shown in FIG. 7A. Had the resist system used been one in which the portion of the resist irradiated did not react with the isocyanate, but non-irradiated portions reacted instead, the structure yielded would have been that shown in FIG. 7B, wherein the non-irradiated areas 28 react to form the urethane. The urethane that was produced absorbs strongly in the 240 to 260 nm light wavelength at which the polymeric resist material was typically exposed in order chemically alter the sensitizer in the irradiated areas.

The resist structure was then flood exposed at a dosage of about 100 mJ/cm$^2$ with 254 nm light, and the exposed resist was heat treated at about 100° C. for a period of about 2 minutes, to generate the phenolic hydroxyl functional groups which render it soluble in solvents such as isopropanol. The polymeric resist material underlying the upper portion of the resist layer which had been converted to the urethane is not soluble in the isopropanol since it was unaffected by the flood exposure at 254 nm light.

Figure 8A:
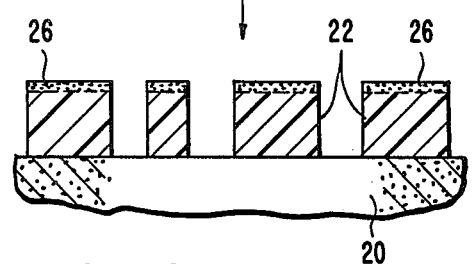
FIG. 8A shows the structure of FIG. 7A after exposure to blanket irradiation (which is strongly absorbed by the dye and to which the polymeric resist material is sensitive) and solvent development which removed the resist material not protected by the absorbing dye, yielding a negative tone patterned resist.
Figure 8B:
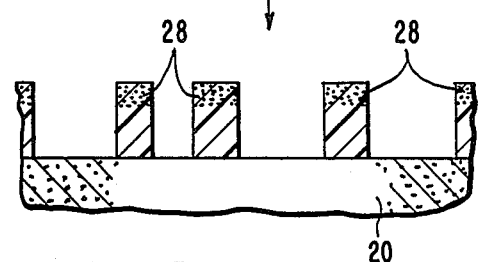
FIG. 8B shows the structure of FIG. 7B after exposure to blanket irradiation and solvent development to yield a positive tone patterned resist.

Subsequently the patterned resist was developed using isopropanol solvent and standard development techniques to produce the negative tone resist structure shown in FIG. 8A. Due to the use of isopropanol developer, the dyed upper portion of the resist 26 was not removed during development. It is not critical that the dyed portion of the resist remain after development, but may be advantageous in that the resultant resist structure is thicker. Had the reverse image structure of FIG. 7B been developed, the positive tone resist structure shown in FIG. 8B would have been generated.

Figure 12:
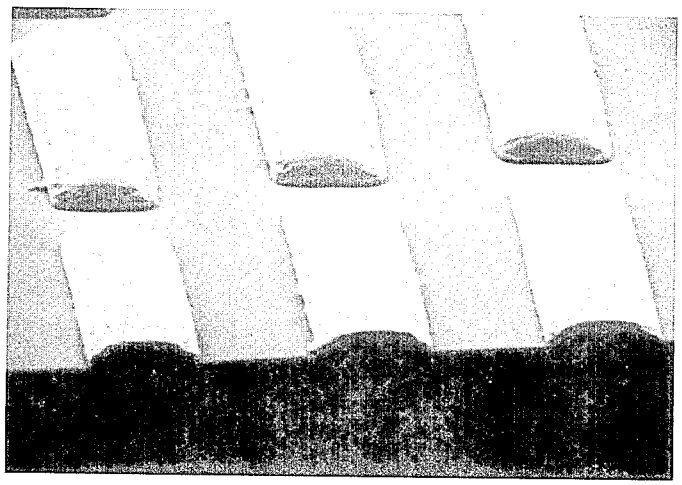
FIG. 12 is a photomicrograph of a top-imaged photoresist wherein a patterned resist was prepared using the technique of converting patterned areas of the upper portion of the layer of polymeric material into a chemically different structure, having altered absorptivity toward radiation, followed by irradiation to create differences in chemical solubility between resist areas underlaying the upper portions having the altered absorptivity and non-altered areas.
Figure 13:
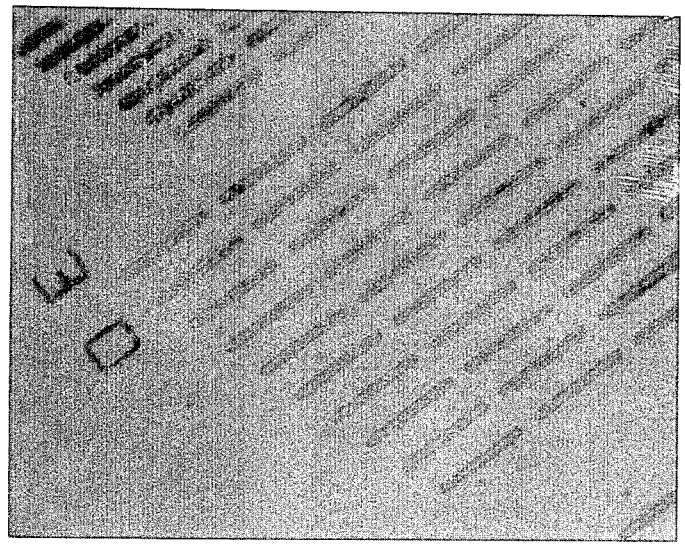
FIG. 13 is an optical micrograph of a top-imaged resist structure of the type shown in FIG. 12, showing an array of 1-2 micrometer lines produced using the method of the present invention as described for FIG. 12.

FIG. 12 is a photomicrograph showing the developed, top-imaged negative tone resist structure (in the form of 3 micrometer lines and spaces) obtained using the above method. FIG. 13 is an optical micrograph showing an array of 1-2 micrometer lines obtained using the above method.

EXAMPLE 4

It has been pointed out that one of the less preferred embodiments of the present invention is to use a transparent resist material and a penetrating source of radiation, and to obtain a top-imaged resist by controlling the process conditions during treatment of the resist with the organometallic reagent, dye, or reagent capable of forming a dye upon reaction with the polymeric portion of the resist. A top-imaged etch-resistant resist structure has been prepared using this method, as described below:

The polymeric resist material was comprised of poly(tert-butyloxycarbonyloxystyrene) in combination with a triphenylsulfonium hexafluoroantimonate sensitizer. The polymeric resist material was placed in a solvent and applied to a semiconductor substrate using spin coating techniques well known in the art, to generate about a 3 micrometer thick film on the semiconductor substrate.

Figure 14:
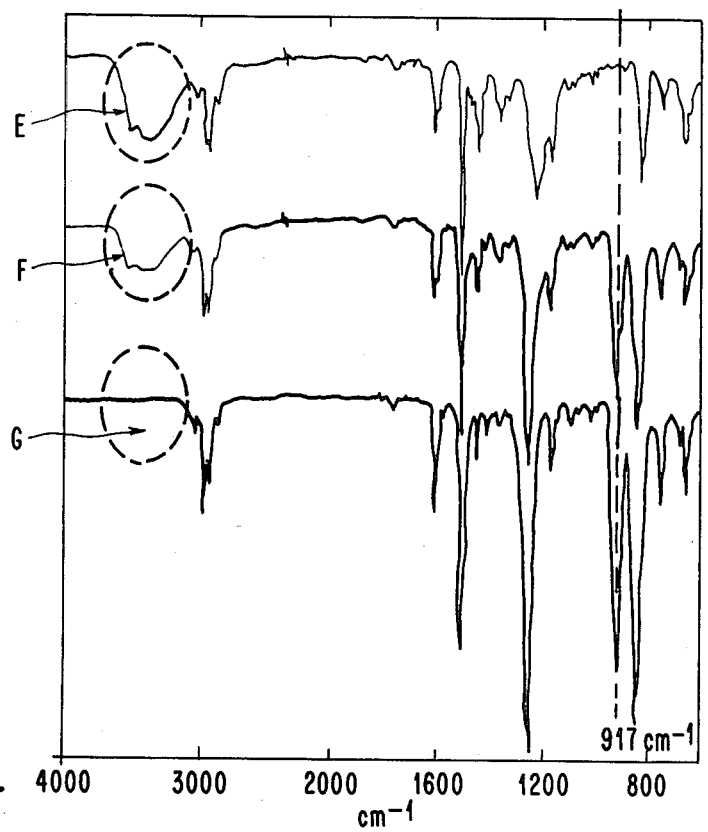
FIG. 14 shows comparitive IR spectra for resists, each of which has been treated with hexamethyldisilazane (HMDS) vapors for increasing time periods, to increase the depth of penetration of the HMDS into the resist.

The resist film was exposed to patterned radiation about 250 nm in wavelength, at a dosage of about 10 mj/cm$^2$. The resist was then heat treated at around 100° C. for about 2 minutes. This exposure and heat treatment liberated the phenolic groups through the entire film thickness in the patternwise-irradiated areas. FIG. 14, E, shows the IR spectrum for the phenolic groups present in the resist film.

Figure 15:
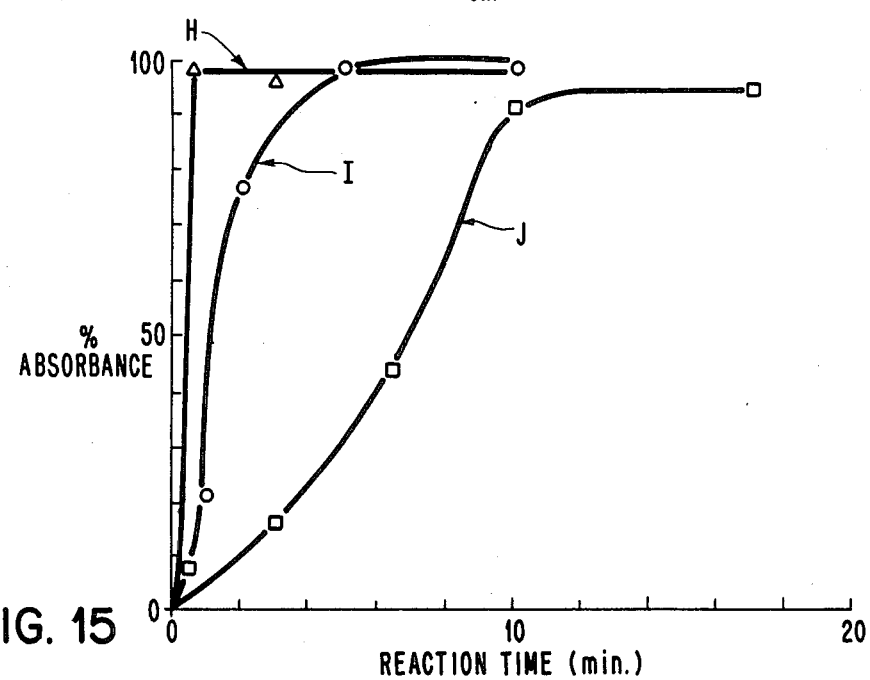
FIG. 15 is a plot of the extent of HMDS incorporation into a resist as a function of reaction time and reaction temperature, as monitored by the increase in SI-O-Ph absorbance.

The resist film was then treated with hexamethyldisilazane (HMDS) vapor at about 120° C. and 100 torr, for a period of about 5 minutes. A portion of the phenolic groups were reacted, and no longer present, as shown in FIG. 14, F. When the treatment with HMDS was continued for an additional 30 minutes (35 minutes total), all of the phenolic groups were reacted, as shown in FIG. 14, G. Since the resist was on a substrate, the HMDS vapor had access only to the top of the film; thus, FIG. 14, F, shows top surface silylation of the phenolic hydroxyl groups by the HMDS silylating reagent. The depth of penetration of the organometallic reagent HMDS into the resist film and the depth to which the film has been rendered etch resistant has, thus, been controlled by controlling HMDS treatment time. Another method of controlling depth of penetration/silylation of the resist thickness is to control the temperature during the HMDS treatment. FIG. 15 shows the extent of HMDS incorporation into a 1 micrometer thick resist film as a function of reaction time and temperature, as monitored by the increase in Si-O-Ph absorbance. FIG. 15, H, shows the 120° C. incorporation rate; FIG. 15, I, shows the 110° C. incorporation rate; FIG. 15, J, shows the 100° C. incorporation rate. Other process parameters such as pressure can be altered to affect the depth of penetration of the HMDS reagent. The same concept can be used to control the depth of penetration of a dye.

Only the preferred embodiments of the invention have been described above, and one skilled in the art will recognize that numerous substitutions, modifications and alterations are permissible without departing from the spirit and scope of the invention, as demonstrated in the following claims.

What is claimed is:

1. A method of converting the upper portion of a layer of polymeric material into a dry etch resistant form, comprising:
   (a) providing a layer of polymeric material comprised of at least one component which undergoes molecular rearrangement upon irradiation to produce reactive hydrogens selected from the group consisting of (1) o-nitrobenzyl derivatives which rearrange on exposure to radiation to form alcohols, acids, and amines, (2) photo-fries reactive units, (3) diazoketones, and (4) mixtures thereof;
   (b) irradiating the surface of said layer of polymeric material to induce molecular rearrangement of said at least one component to form reaction products having reactive hydrogens in at least the upper portion of said irradiated layer; and
   (c) treating said reaction products of said irradiated layer with a reactive organometallic reagent to react and bond said organometallic reagent at said reactive sites in the upper portion of said layer of polymeric material, whereby said upper portion is dry etch resistant.

2. The method of claim 1 wherein said component of said polymeric material is selected from the group consisting of

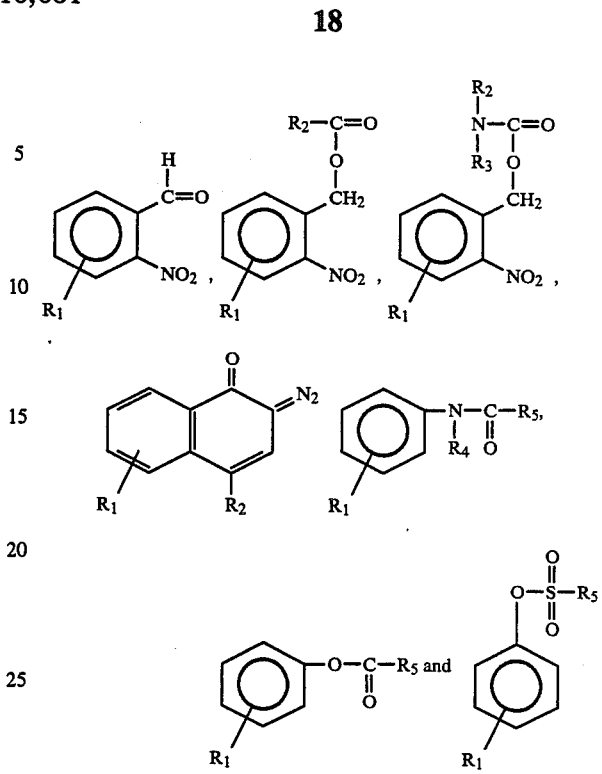

wherein $R_1$, $R_2$, $R_3$ and $R_5$ 32 H, alkyl, aryl, or part of a polymer backbone and $R_4=H$, $C_nH_{2n+1}$ wherein n ranges from about 1 to about 5, phenyl or substituted phenyls.

3. The method of claim 2 wherein $R_1$=part of a styrene polymer backbone, wherein said polymer is a polymer or an acrylate polymer; $R_2$, $R_3$ and $R_5=H$, $C_nH_{2n+1}$ wherein n ranges from 1 to about 15, phenyl, and substituted phenyls; and $R_4=H$, $C_nH_{2n+1}$ wherein n ranges from 1 to about 5, phenyl and substituted phenyls.

4. The method of claim 1 wherein said irradiation source is selected from the group consisting of photon emission sources, electron beam, ion beam, and X-ray.

5. The method of claim 4 wherein said irradiation source is a low acceleration voltage electron beam and wherein said electron beam voltage ranges from about 0.5 Kev to about 10 Kev.

6. The method of claim 1 wherein the irradiation of said layer is pattern-wise irradiation, so that said reaction products having said reactive hydrogens are created only in the pattern-wise irradiated areas.

7. The method of claim 6 including the additional step of:
   developing the patterned image in said irradiated and reacted areas by treatment with an oxygen plasma.

8. The method of claim 1 wherein said layer of polymeric resist material ranges from about 0.5 to about 20 micrometers in thickness.

9. The method of claim 8 wherein said upper portion of said layer of polymeric resist material or sensitized polymeric resist material ranges from about 0.1 to about 1.0 micrometer in depth.

10. The method of claim 1 wherein said molecular rearrangement of said at least one component extends primarily within said upper portion of said layer of polymeric material.

11. The method of claim 8 wherein said layer of polymeric resist material ranges from about 1.0 to about 3.0 micrometers in thickness.

12. The method of claim 11 wherein said upper sensitized portion of said layer of polymeric resist material or of said polymeric resist material ranges from about 0.1 to about 0.5 micrometers in depth.

13. The method of claim 12 wherein said molecular rearrangement of said at least one component extends primarily within said upper portion of said layer of polymeric material.

14. The method of claim 1 wherein said reactive organometallic reagent is comprised of a silicon-containing compound.

15. The method of claim 3 wherein said layer of polymeric resist material ranges from about 0.5 to about 20 micrometers thick.

16. The method of claim 15 wherein said upper portion of said layer of polymeric material ranges from about 0.1 to about 1.0 micrometer in depth.

17. Product produced by the method of claim 1.

18. A method of converting the upper portion of a layer of polymeric resist to a dry etch resistant form, comprising:
   (a) applying a layer of polymeric material to said substrate, wherein said polymeric material is comprised of at least one component which undergoes molecular rearrangement on irradiation to produce labile and reactive hydrogens selected from the group consisting of (1) o-nitrobenzyl derivatives which rearrange on exposure to radiation to form alcohols, acids, and amines, (2) photo-fries reactive units, (3) diazoketones, and (4) mixtures thereof;
   (b) pattern-wise irradiating surface portions of said layer of polymeric material to induce molecular rearrangement of said component and the formation of and reactive hydrogens within at least the upper portion of said pattern-wise irradiated area; and
   (c) treating said reaction products of said irradiated layer with a reactive organometallic reagent to react and bond said organometallic reagent at said reactive sites within the upper portion of said irradiated layer.

19. The method of claim 18 wherein said irradiation source is selected from the group consisting of photon emission sources, electron beam, ion beam, and X-ray.

20. The method of claim 19 wherein said irradiation source is a low acceleration voltage electron beam and wherein said electron beam voltage ranges from about 0.5 Kev to about 10 Kev.

21. The method of claim 20, wherein said layer of polymeric material is about one to about three micrometers thick.

22. The method of claim 18 wherein said irradiated upper portion of said pattern-wise irradiated areas ranges from about 0.1 to about 0.5 micrometers in depth.

23. The method of claim 18 wherein said substrate comprises a polymeric material which is not radiation sensitive.

24. The method of claim 18 wherein said substrate comprises a polymeric material which is radiation sensitive.

25. The method of claim 18 wherein said substrate comprises an inorganic material.

26. Product produced by the method of claim 18.

27. The method of claim 1 wherein said conversion to a dry-etch resistant form is limited to the upper portion of said layer of polymeric resist material or said layer of sensitized polymeric resist material by controlling the process conditions during treatment with the organometallic reagent, so that penetration of said organometallic reagent is limited to said upper portion of said layer of polymeric material or said layer of polymeric resist material.

28. The method of claim 18 wherein said conversion of said upper portion of said layer of polymeric material or said layer of polymeric resist material by controlling the process conditions during treatment, so that penetration of said organometallic reagent is limited to said upper portion of said layer of polymeric material or said layer of polymeric resist material.

* * * * *